(12) United States Patent
Lu et al.

(10) Patent No.: US 10,622,451 B1
(45) Date of Patent: Apr. 14, 2020

(54) FLASH MEMORY WITH MULTIPLE CONTROL GATES AND FLASH MEMORY ARRAY DEVICE MADE THEREOF

(71) Applicant: NATIONAL CHENG KUNG UNIVERSITY, Tainan (TW)

(72) Inventors: Darsen Duane Lu, Tainan (TW); Yi-Chi Wang, New Taipei (TW); Huai Kuan Zeng, Kaohsiung (TW)

(73) Assignee: NATIONAL CHENG KUNG UNIVERSITY, Tainan (TW)

( * ) Notice: Subject to any disclaimer, the term of this patent is extended or adjusted under 35 U.S.C. 154(b) by 0 days.

(21) Appl. No.: 16/213,713

(22) Filed: Dec. 7, 2018

(51) Int. Cl.
| | |
|---|---|
| *H01L 29/423* | (2006.01) |
| *H01L 27/11568* | (2017.01) |
| *H01L 27/11521* | (2017.01) |
| *G11C 16/04* | (2006.01) |
| *H01L 29/792* | (2006.01) |
| *H01L 29/788* | (2006.01) |

(52) U.S. Cl.
CPC ........ *H01L 29/42348* (2013.01); *G11C 16/04* (2013.01); *H01L 27/11521* (2013.01); *H01L 27/11568* (2013.01); *H01L 29/42332* (2013.01); *H01L 29/7881* (2013.01); *H01L 29/792* (2013.01)

(58) Field of Classification Search
CPC ......... H01L 29/42348; H01L 29/42324; H01L 29/792; H01L 29/788; H01L 27/11521; H01L 27/11524; H01L 2924/13085; H01L 2924/13081; H01L 2924/13092
See application file for complete search history.

(56) References Cited

U.S. PATENT DOCUMENTS

2019/0043569 A1* 2/2019 Chen ................... G11C 11/5671

* cited by examiner

*Primary Examiner* — Hsien Ming Lee
(74) *Attorney, Agent, or Firm* — Maschoff Brennan

(57) ABSTRACT

The present disclosure relates to a flash memory having a plurality of control gates, including: a substrate. An oxide layer disposed on the substrate. A fin-shaped channel layer disposed on the oxide layer, and includes a first end portion, a second end portion, a top surface and two side surfaces, wherein the top surface and the two side surfaces are located between the first end portion and the second end portion, the top surface faces away from the oxide layer and separates the two sides. The two charge storage structures are respectively disposed on the two sides of the fin channel layer. The two gates are disposed on the oxide layer and respectively contact with the two charge storage structures. Two word conductive pillars are connected to the two gates respectively and extending from the two gates in a direction leaving the oxide layer.

17 Claims, 9 Drawing Sheets

FLASH MEMORY WITH MULTIPLE CONTROL GATES AND FLASH MEMORY ARRAY DEVICE MADE THEREOF

TECHNICAL FIELD

The present disclosure relates to a flash memory having a plurality of control gates, and a flash memory array device.

BACKGROUND

In present use, a flash memory can be used as a data storage. Traditionally, the flash memory is usually a two-dimensional array structure. In recent years, there have been many three-dimensional memory devices, which have increased the amount of data stored per unit area. The key principle of flash memory lies in that, via high voltage writing, a flash memory can store data in the critical voltage mode of the transistor. Furthermore, a flash memory can also be used as a computing unit in a neural network circuit.

However, the disadvantage with the use of traditional planar flash memory is that its transistor can only store one analog datum through the threshold voltage. And the traditional FinFET structure has the same gate voltage on both sides, and both ends must be read/write at the same time. Furthermore, although the 3D memory arrays today may increase the storage density per unit area, they are extremely costly to develop and are not suitable for NOR connections (source grounding) of neural networks.

SUMMARY

In view of this, the present disclosure is going to provide a flash memory having a plurality of control gates that store charge on both sides of the memory element (double gate) and double the information density. There are double-ended control of the memory read/write capability, thus double the layout density of the memory array.

The present disclosure relates to a flash memory having a plurality of control gates, including: a substrate. An oxide layer disposed on the substrate. A fin-shaped channel layer disposed on the oxide layer, and includes a first end portion, a second end portion, a top surface and two side surfaces, wherein the top surface and the two side surfaces are located between the first end portion and the second end portion, the top surface faces away from the oxide layer and separates the two sides. The two charge storage structures are respectively disposed on the two sides of the fin channel layer. The two gates are disposed on the oxide layer and respectively contact with the two charge storage structures. Two word conductive pillars are connected to the two gates respectively and extending from the two gates in a direction leaving the oxide layer. And two word lines, respectively connected to the two word conductive pillars, the orthogonal projection of the two word lines on the substrate intersects with the orthographic projection of the fin channel layer on the substrate.

The present disclosure also relates to a flash memory array device including: a first flash memory, having a plurality of control gates as described above. And a second flash memory, having a plurality of control gates as described above. The bit line of the first flash memory and the bit line of the second flash memory form a first bit line, and the substrates of the first and second flash memory are the same substrate, and the oxide layer of the first and second flash memory is the same oxide layer.

BRIEF DESCRIPTION OF THE DRAWINGS

Additional features and advantages of the present disclosure are described with reference to the drawings. The description is made with reference to the drawings, which are intended to illustrate embodiments of the disclosure. It should be understood that these examples do not represent the full scope of the invention.

DETAILED DESCRIPTION

The detailed features and advantages of the present disclosure are described in detail below in the embodiments of the present disclosure. The objects and advantages associated with the present disclosure can be readily understood by those skilled in the art. The following examples are intended to describe the present disclosure in further detail, but do not limit the scope of the invention in any way.

Figure 1A:
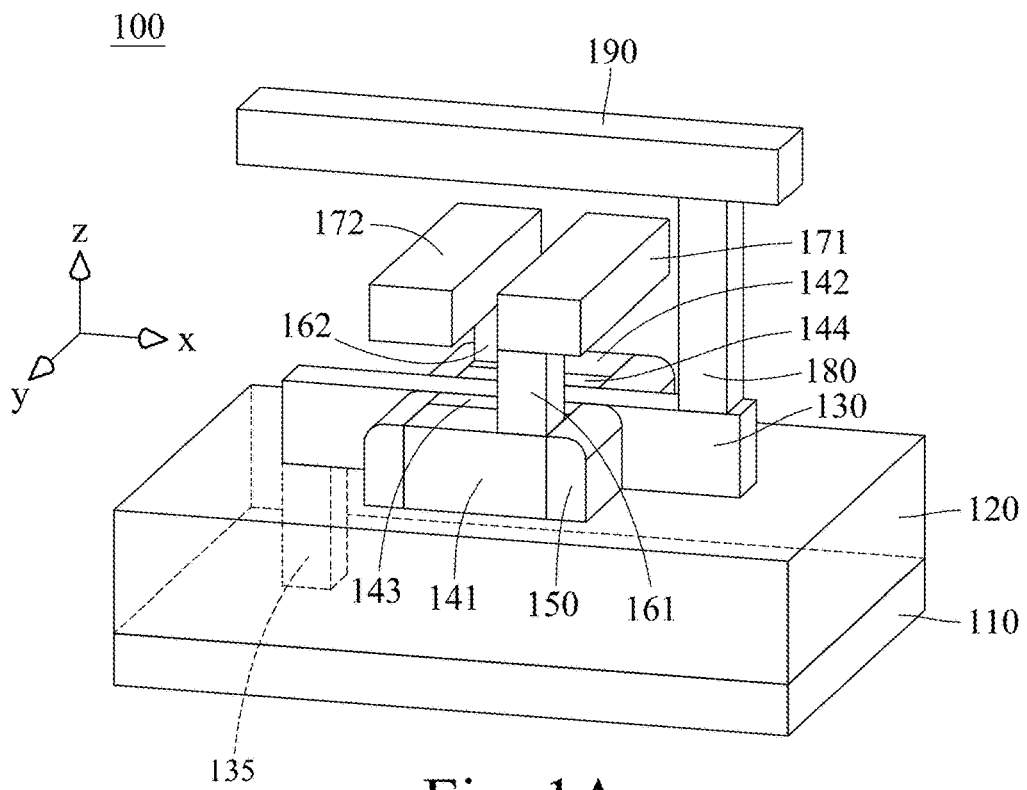
FIGS. 1A and 1B are schematic diagrams showing a flash memory having a plurality of control gates in accordance with a first embodiment of the present disclosure.
Figure 1B:
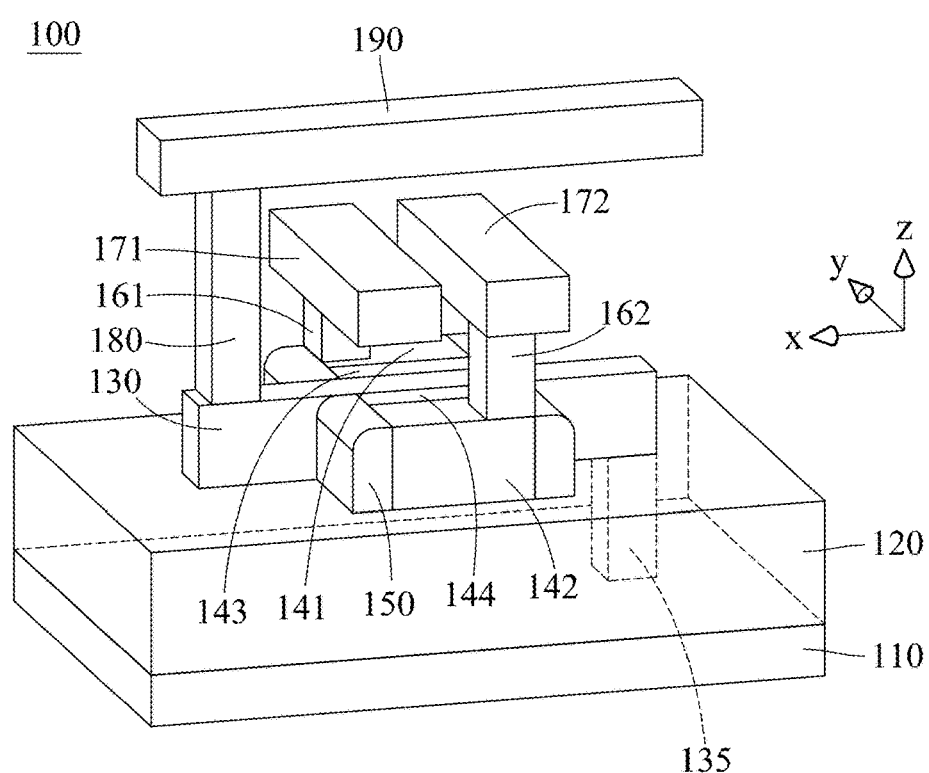

Please refer to FIGS. 1A and 1B, which illustrates a first embodiment of a flash memory having a plurality of control gates of the present disclosure, wherein FIG. 1A is viewed from one side of the flash memory, and FIG. 1B is viewed from the opposite side of the flash memory. The flash memory 100 includes a substrate 110, an oxide layer 120, a fin channel layer 130, a substrate conductive pillar 135, two gates 141, 142, two charge storage structures 143, 144, a spacer 150, and two word conductive pillars 161, 162, two word lines 171, 172, a bit conductive columns 180, a bit line 190.

In FIGS. 1A and 1B, the oxide layer 120 is disposed on the substrate 110. The fin channel layer 130 is disposed on the oxide layer 120, with the fin channel layer 130 containing silicon or germanium and including a first end portion, a second end portion, a top surface and two side surfaces. The top surface and the two side surfaces of the fin channel layer 130 are located between the first end portion and the second end portion, wherein the top surface faces away from the oxide layer 120 and separates the two side surfaces. The charge storage structures 143, 144 are respectively disposed on the two side surfaces of the fin channel layer 130. The gates 141 and 142 are disposed on the oxide layer 120 and are respectively in contact with the charge storage structures 143, 144, wherein the charge storage structures 143 and 144 are sandwiched between the gates 141 and 142 and the two side surfaces of the fin channel layer 130. The word conductive pillars 161, 162 are connected to the gates 141, 142 respectively, and extend from the gates 141, 142 in a direction leaving the oxide layer 120. The word lines 171, 172 are connected to the word conductive pillars 161, 162 respectively, and the orthographic projections of the two word lines 171, 172 on the substrate 110 intersect the orthographic projection of the fin channel layer 130 on the substrate 110. In this embodiment, the bit conductive pillars 180 are longer than the word conductive pillars 161, 162, such that the word lines 171, 172 are located between the oxide layer 120 and the bit line 190. In the above structure, the doping concentration of the fin channel layer 130 is relatively high, between about $5 \times 10^{20}$ $cm^{-1}$ and $2 \times 10^{19}$ $cm^{-1}$. With the above structure, when the writing signal is inputted to only one of the two gates 141 and 142, the operation on that one gate exhausts the doping in the fin channel layer 130 thus the other gate is hardly affected. Furthermore, with the word lines 171, 172 having orthographic projections crossing the fin channel layer 130, the two gates can be operated independently, and the structure of the separately controlled flash memory would be compact.

Each of the two charge storage structures 143, 144 has a barrier insulating layer, a charge storage layer and a tunneling insulating layer (not shown in FIG. 1 but will be further illustrated in the later contents), wherein the flash memory of the present disclosure can be a symmetrical structure. The electrodes in the gates 141, 142 are not connected to each other, so they can operate independently. The charge storage layer may be of other structures or materials such as silicon nitride (SONOS), polysilicon floating-gates of highly doped germanium, quantum dots, and the alike.

The operation of reading/writing/erasing is performed by applying appropriate bias voltages to the gates 141, 142. When applying a high voltage to either the gate 141 or the gate 142, an electric field with positive charges around the gate 141 or 142 is formed due to the applied high voltage. The electric field causes electrons to go through the tunneling insulating layer to the charge storage layer from the substrate 110 to complete the writing operation. With the above operation, the electrons are blocked by the two insulating layers and stored in the charge storage layer, and the threshold voltage of the component is raised. Alternatively, electronic writing can also be carried out by generating hot carrier injection through the high current in the channel. Since the gates 141, 142 are able to operate independently, we can selectively inject the charge into the charge storage structure 143 contacting the gate 141 or the charge storage structure 144 contacting the gate 142.

After the writing operation is completed, when applying a low voltage to the gate 141 or 142 provided with the high voltage previously, the electric field will be changed to an electric field with negative charges around the gate 141 or 142 due to the applied low voltage. Accordingly, the electrons stored in the charge storage layer return to the substrate 110 through the tunneling insulating layer, thus no electrons will be in the charge storage layer, thereby the erasing process completed. With this operation, the threshold voltage of the component drops.

Through the above operations, the electrons in the charge storage layers of the charge storage structures 143, 144 will change the threshold voltages of the device. Furthermore, for a reading operation, a lower voltage can be applied to the gates 141, 142 to determine the threshold voltages of the charge storage layers by the channel current. Thus, it may determine whether there is a charge saved in the charge storage structures 143, 144 to complete the reading operation. Since the gates 141, 142 are operable independently, it is selectable to read either one of the threshold voltages of the two gates 141, 142, whereby the structure disclosed in the present disclosure can store two different pieces of information.

Figure 2:
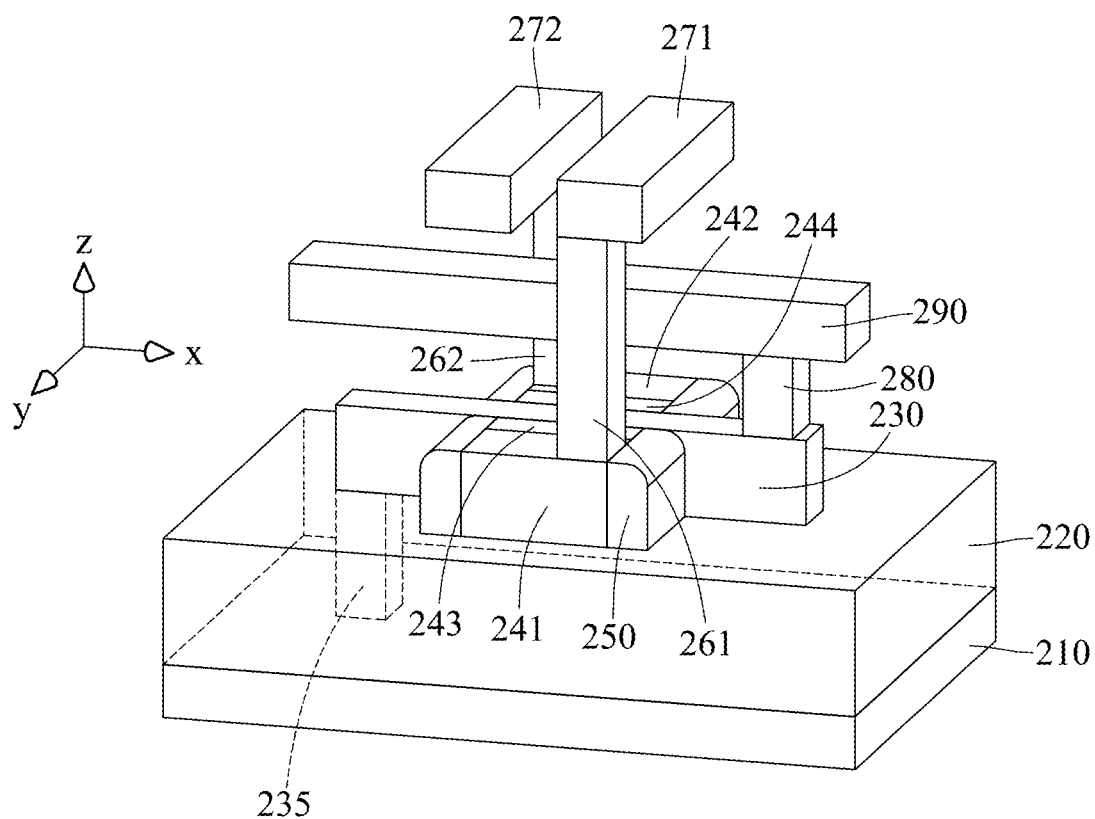
FIG. 2 is a schematic diagram showing a flash memory having a plurality of control gates in accordance with a second embodiment of the present disclosure.

Please refer to FIG. 2, which illustrates a second embodiment of a flash memory having a plurality of control gates of the present disclosure. The fin field effect transistor 200 includes a substrate 210, an oxide layer 220, a fin channel layer 230, a substrate conductive pillar 235, gate electrodes 241, 242, spacers 250, word conductive pillars 261, 262, and word lines 271, 272, bit conductive pillar 280 and bit line 290.

In FIG. 2, the arrangement of the components is similar to that shown in FIG. 1. However, this second embodiment is different from the first embodiment in that the bit line 290 of the second embodiment is located between the word lines 271, 272 and the oxide layer 220, and the word conductive pillars 261, 262 are longer than the bit conductive pillars 290. Thereby, the relative positions of the word lines 271, 272 and the bit lines 290 can be adjusted depending on the overall setting requirements.

Referring to FIGS. 3A-3H, in order to illustrate the fabrication of the flash memory clearly, as an example, the following is the fabrication description of the first embodiment of the flash memory having a plurality of control gates of the present disclosure.

Figure 3A:
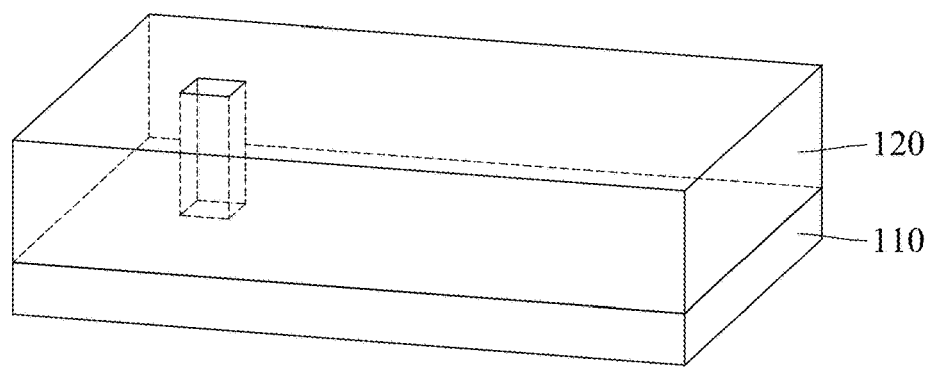
FIG. 3A-3H are schematic diagrams showing a manufacturing process of a flash memory having a plurality of control gates in accordance with the present disclosure.

Please refer to FIG. 3A. The oxide layer 120 is formed on the substrate 110 by fabricating the elements on the SOI wafer.

Figure 3B:
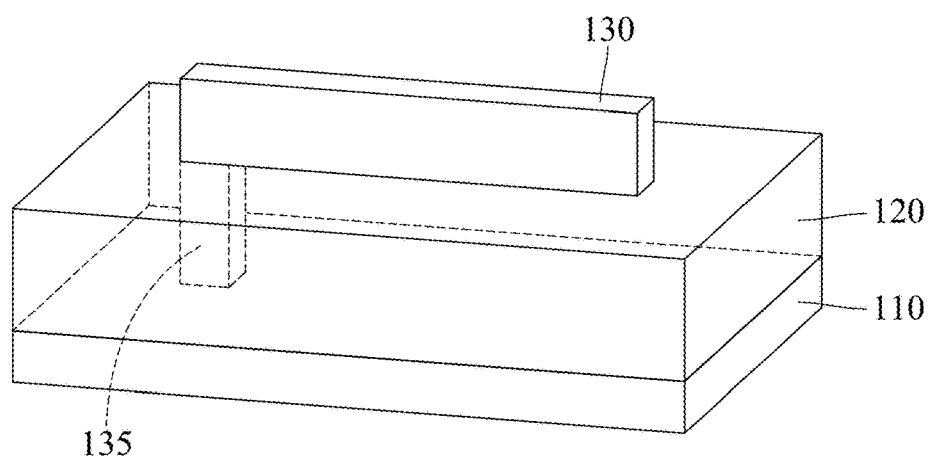

Please refer to FIG. 3B. The rectangular fin channel layer 130 is formed on the oxide layer 120 by lithography and etching.

Figure 3C:
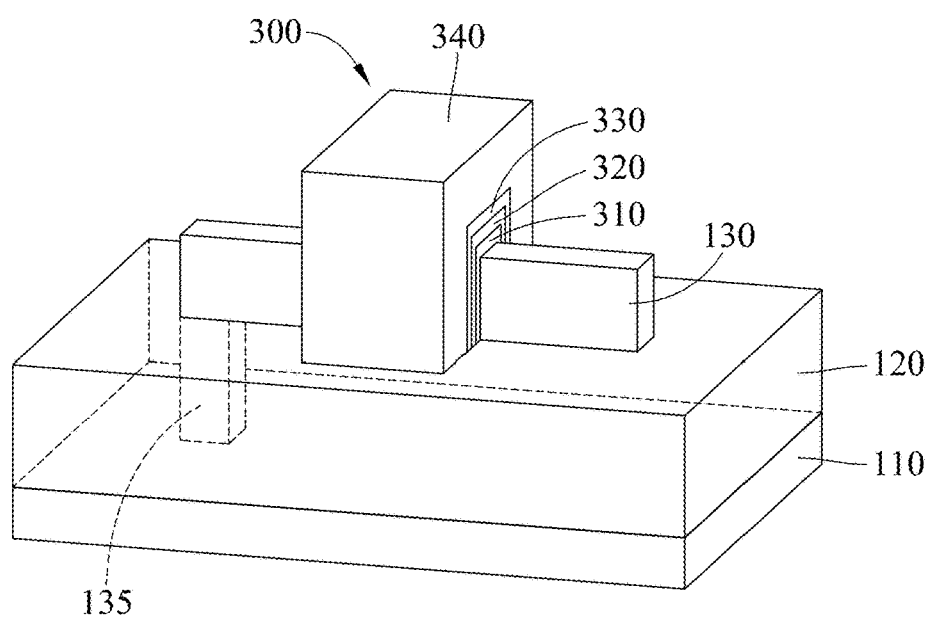

Referring to FIG. 3C, a gate structure 300 configured to from the gates 141, 142 as well as the charge storage structures 143, 144 is formed. Specifically, the tunneling insulating layer 310, charge storage layer 320, and blocking insulating layer 330 are deposited from the inside to the outside covering the fin channel layer 130. The gate material 340 is then deposited on the blocking insulating layer 330. The gate shape is defined by lithography and etching.

Figure 3D:
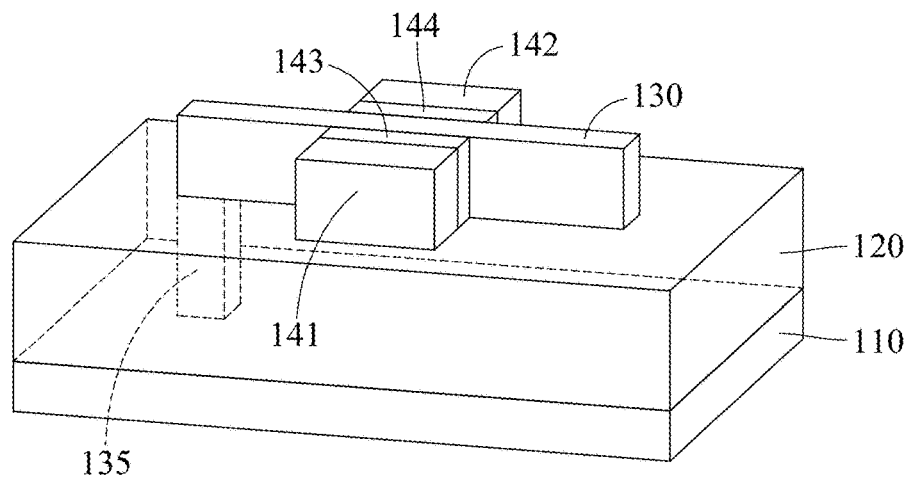

Referring to FIG. 3D, the gate structure 300 is separated into two parts to form the gates 141, 142 as well as the charge storage structures 143, 144 by a chemical-mechanical planarization (CMP) process.

Figure 3E:
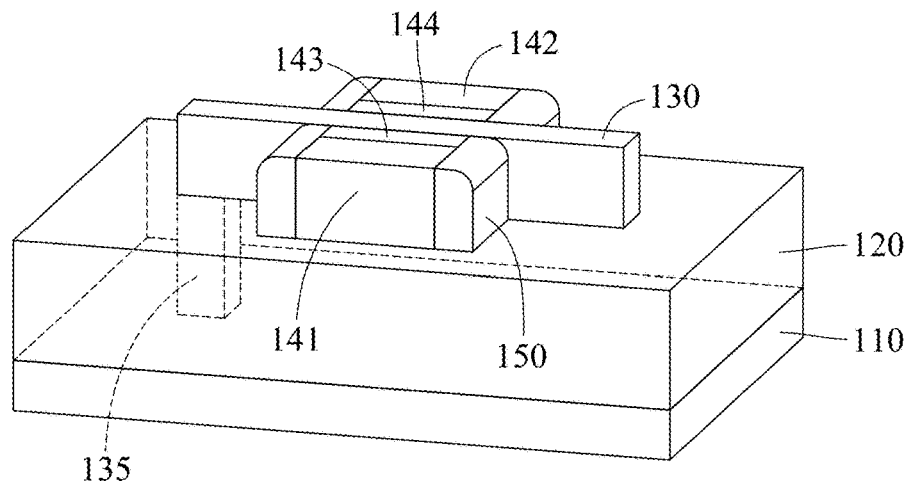

Referring to FIG. 3E, spacers 150 are formed by deposition and plasma etching on the sides of the gates 141, 142, with said sides next and perpendicular to the fin channel layer 130.

Figure 3F:
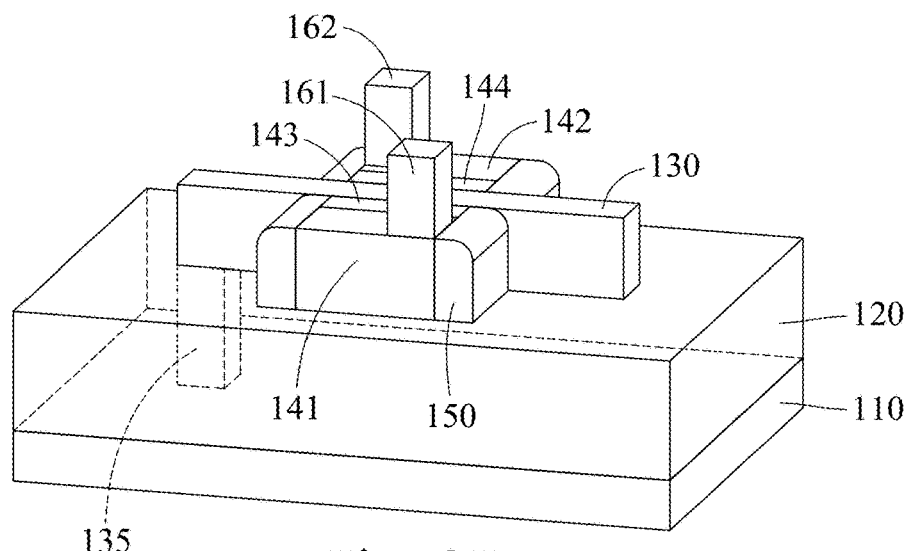

Referring to FIG. 3F, word conductive pillars 161, 162 are formed above the gates 141, 142 respectively.

Figure 3G:
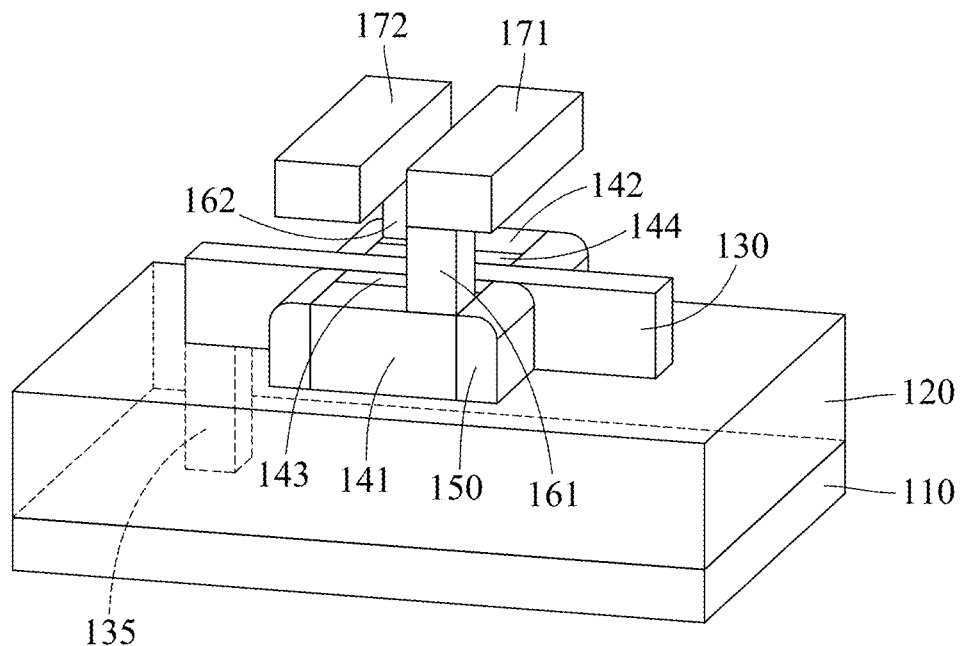

Referring to FIG. 3G, the word lines 171, 172 are formed on the word conductive pillars 161, 162 respectively, by a back-end process.

Figure 3H:
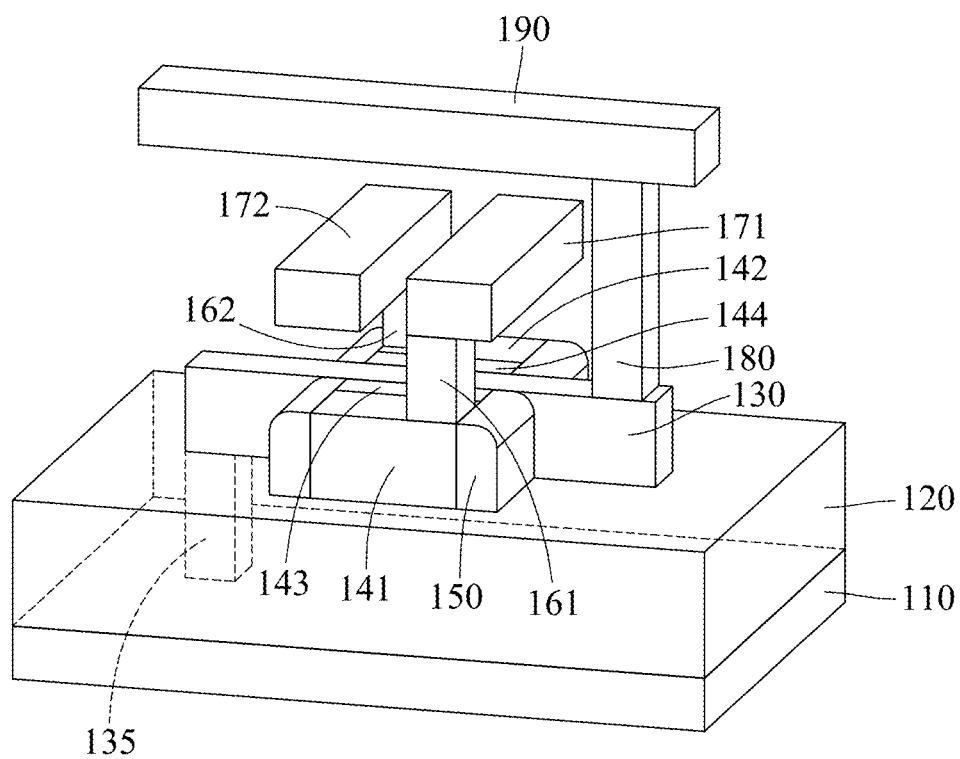

Referring to FIG. 3H, the bit conductive pillar 180 is formed on the first end of the fin channel layer 130. A bit line 190 is then formed on the bit conductive pillar 180.

In comparison with the manufacturing process of the first embodiment shown in FIGS. 3A to 3H, the difference in the fabrications between the first and the second embodiments lies in that, for the second embodiment of the present disclosure, after the spacer 150 is formed by deposition and plasma etching, the bit conductive pillar 180 is first formed on the first end of the fin channel layer 130 before the word conductive pillars 161, 162 are formed. Specifically, after the setting of the bit conductive pillar 180, the bit line 190 is then formed on the bit conductive pillars 180. Then, above the gate electrodes 141, 142, the word conductive pillars 161, 162 are formed respectively for the word lines 171, 172 to form above the word conductive pillars 161, 162 respectively.

Figure 4:
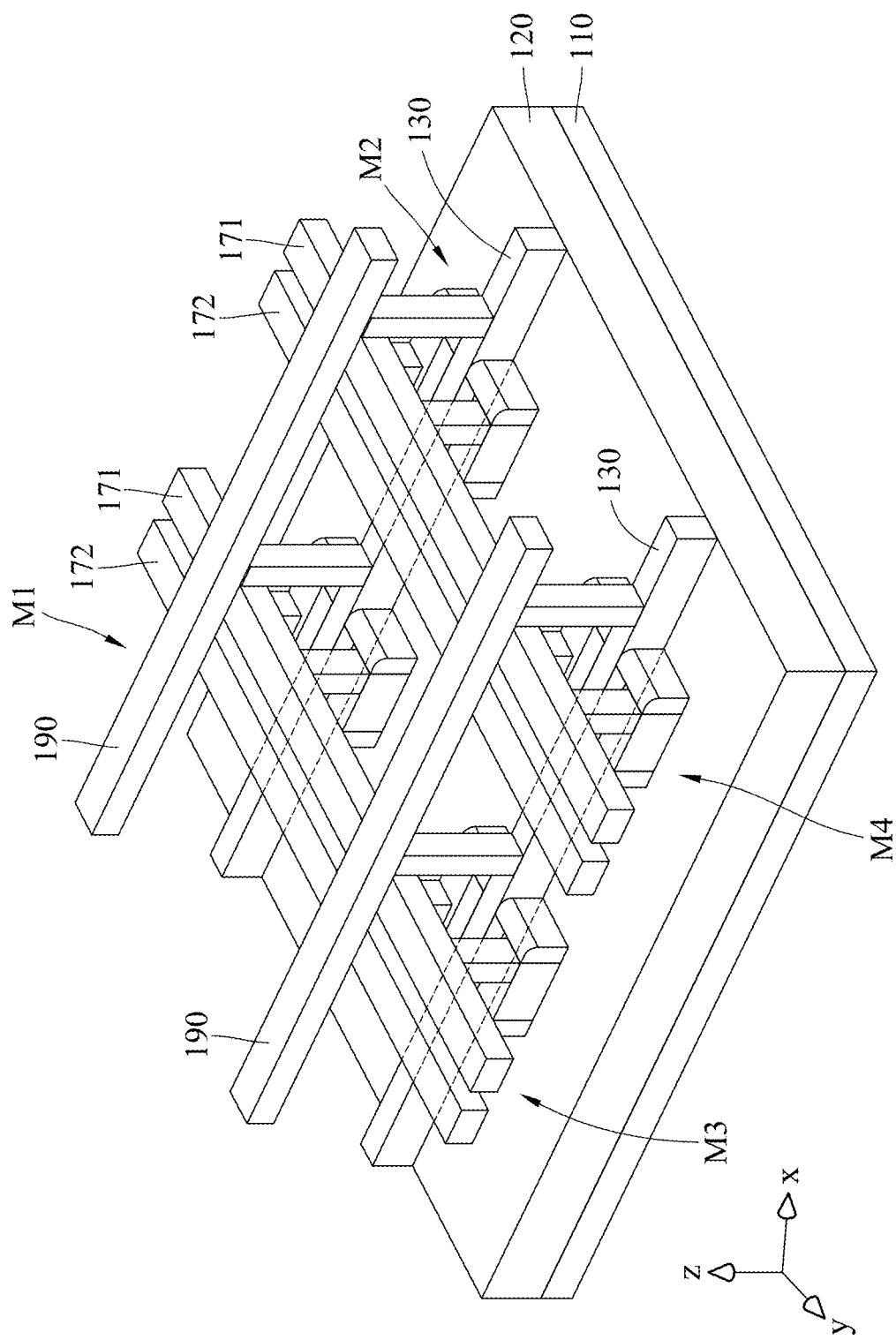
FIG. 4 is a schematic diagram showing a flash memory array device composed of a plurality of flash memories having a plurality of control gates.

FIG. 4 is a flash memory array device comprising a plurality of flash memories having a plurality of control gates, with the flash memory array device comprising a first flash memory M1, a second flash memory M2, a third flash memory M3, and a fourth flash memory M4. The first flash memory M1 and the second flash memory M2 are arranged to align in a X direction, and the first flash memory M1 and the third flash memory M3 are arranged to align in a Y direction. In practice, more flash memories can be connected and arranged based on the two directions in need of forming a larger flash memory array so as to provide a greater memory capacity. In addition, it is preferable that the substrates 110 of the flash memories M1 to M4 are four parts of a single substrate, while the oxide layers 120 of them are four parts of a single oxide layer.

Particularly, in the Y direction of FIG. 4, the word line 171 of the first flash memory M1 and the word line 171 of the third flash memory M3 are connected to jointly form a first word line, and the word line 172 of the first flash memory M1 and the word line 172 of the third flash memory M3 are connected to jointly form a second word line. Similarly, the word line 171 of the second flash memory M2 and the word line 171 of the fourth flash memory M4 are connected to each other to jointly form a third word line, and the word line 172 of the second flash memory M2 and the word line 172 of the fourth flash memory M4 are connected to jointly form a fourth word line.

In addition, in the X direction of FIG. 4, the first end portion of the fin channel layer 130 of the first flash memory M1 and the second end portion of the fin channel layer 130 of the second flash memory M2 are connected to each other, and the bit line 190 of the first flash memory M1 and the bit line 190 of the second flash memory M2 are connected to jointly form a first bit line. Similarly, the first end portion of the fin channel layer 130 of the third flash memory M3 and the second end portion of the fin channel layer 130 of the fourth flash memory M4 are also connected to each other, and the bit line 190 of the third flash memory M3 and the bit line 190 of the fourth flash memory M4 are connected to jointly form a second bit line.

Figure 5:
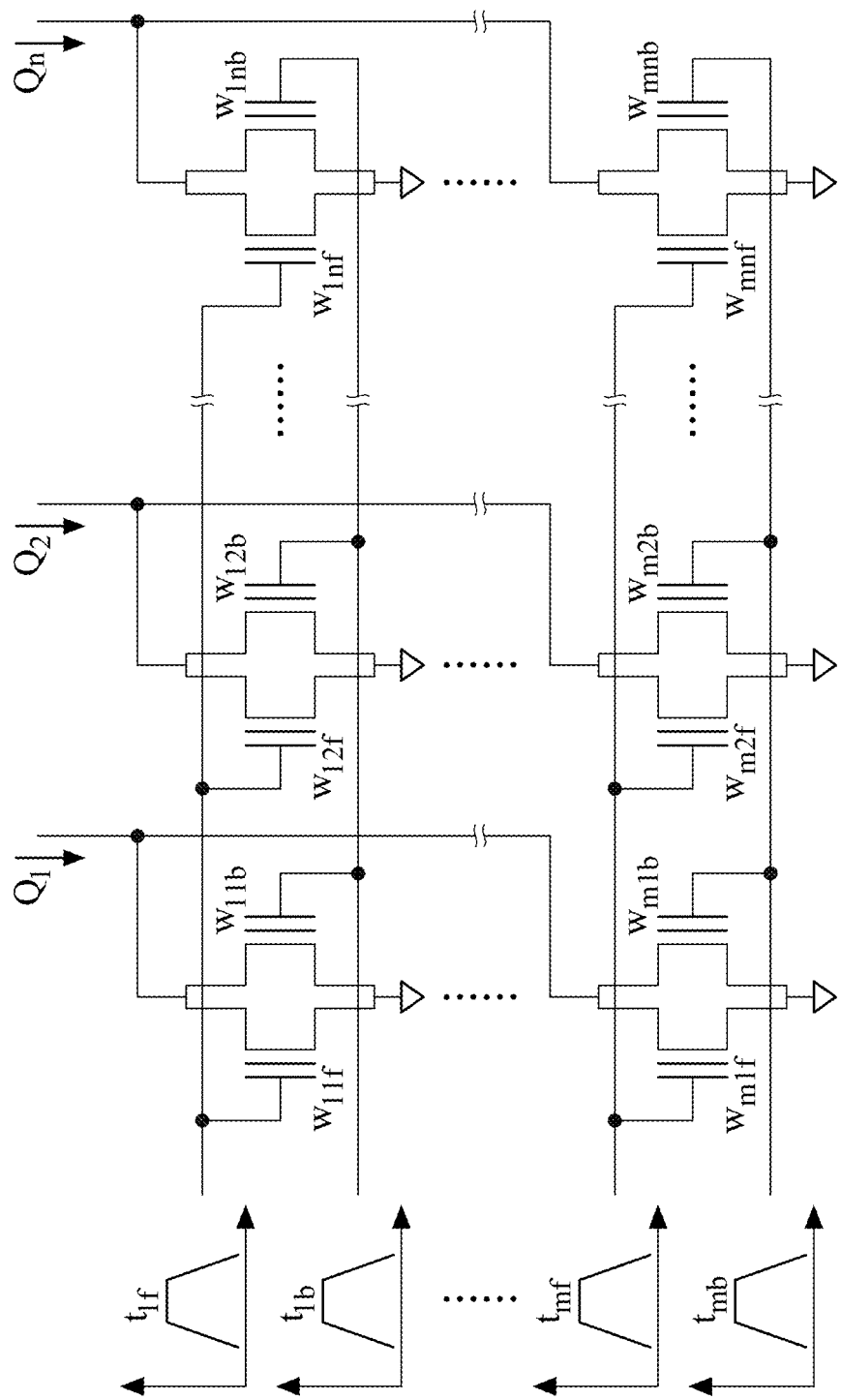
FIG. 5 is a circuit diagram showing a neural network such as a composition of a flash memory array device.
Figure 6:
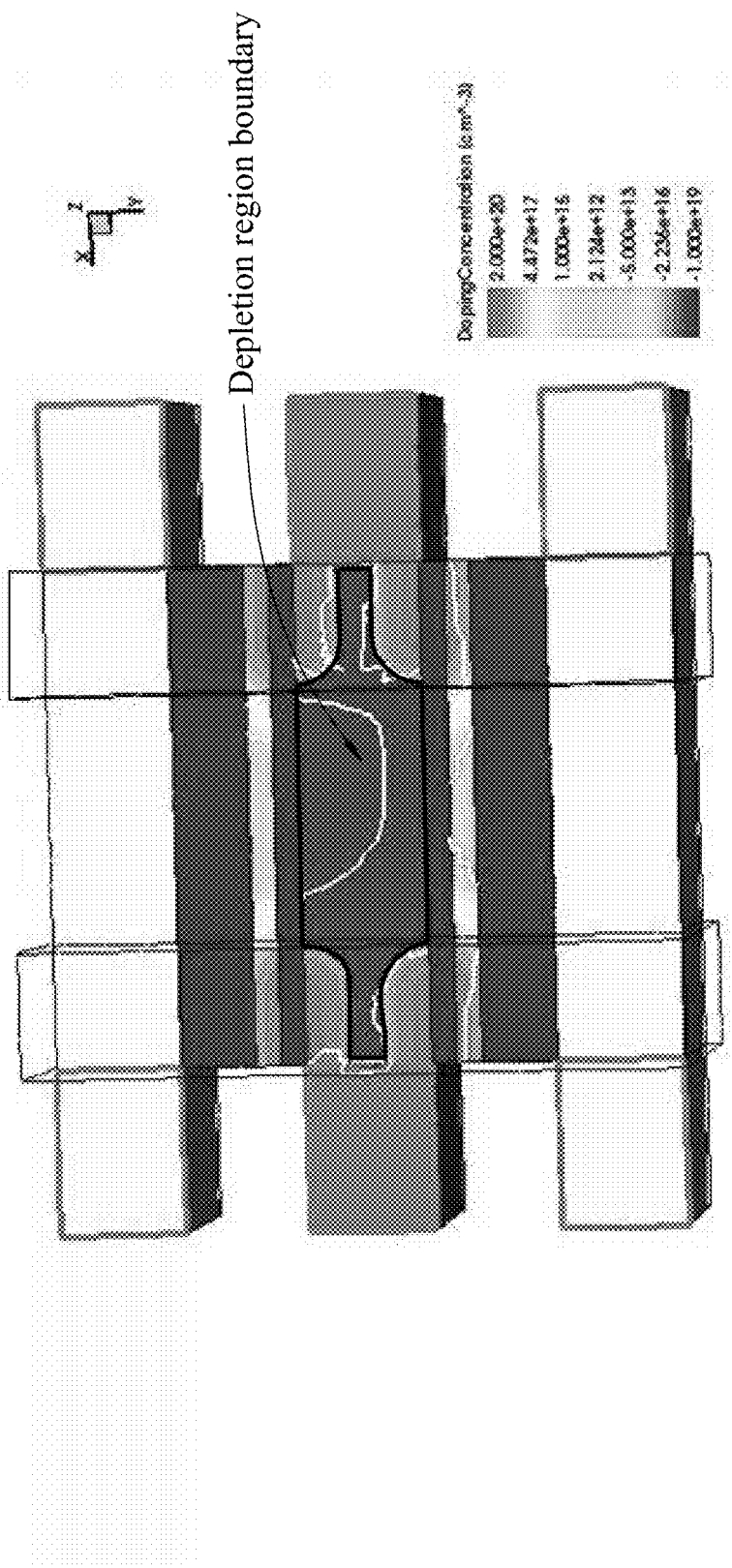
FIG. 6 is a schematic diagrams showing the doping distribution inside the fin channel layer when using the TCAD (Technology Computer Aided Design) to simulate the situation of writing only the front gate of the fin channel layer.
Figure 7:
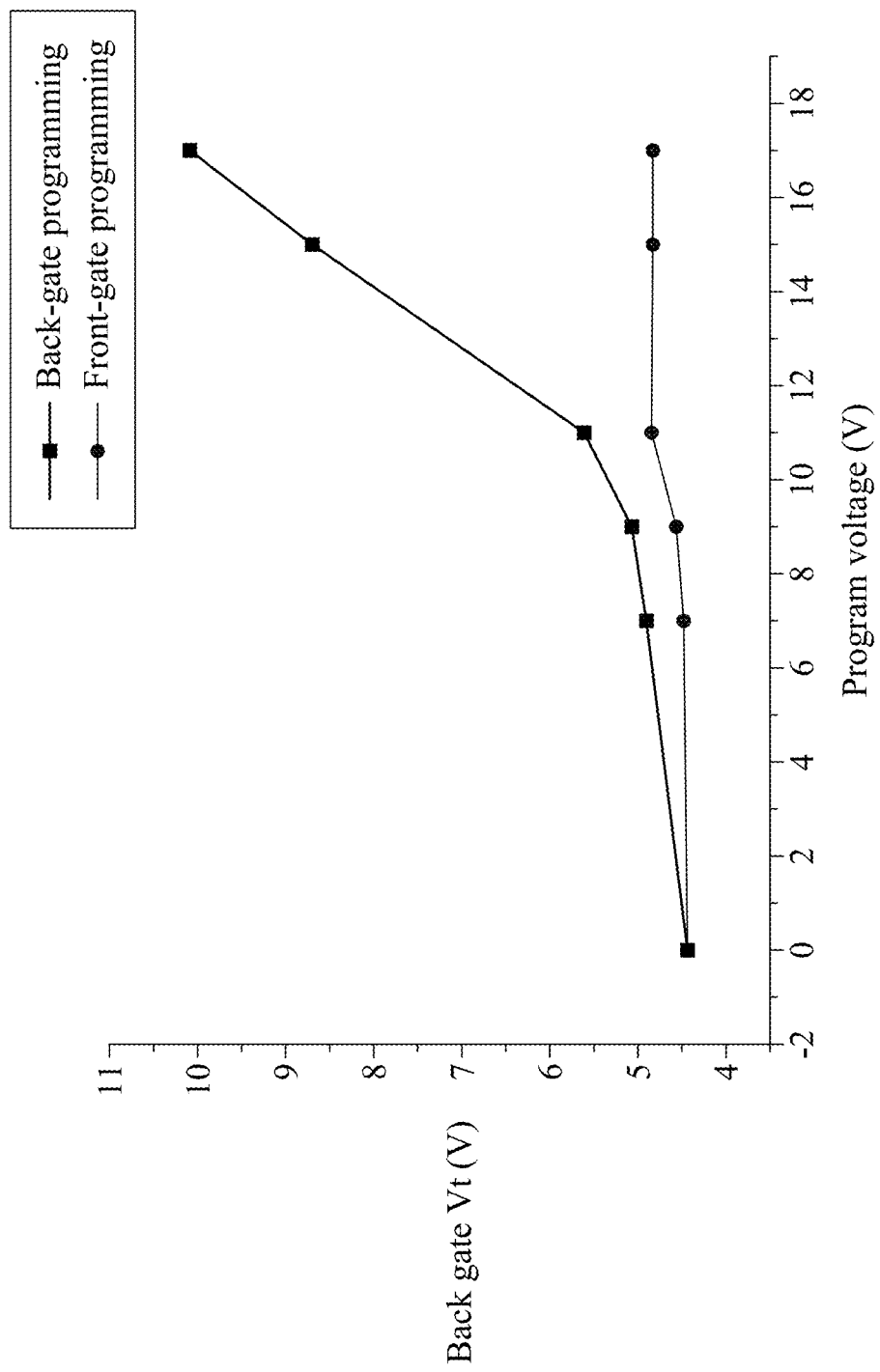
FIG. 7 is a schematic diagrams showing the change of Vt of the rear gate when using the TCAD (Technology Computer Aided Design) to simulate the situation of writing only the front gate of the fin channel layer.

Generally, non-volatile memory can be used in the field of artificial neural network (Neuromorphic) and Deep Learning (Artificial Intelligence, AI). Due to the characteristics of the artificial intelligence algorithm, the learning process needs to be completed by weight values. The weight values depend on the memory function of the memory array so as to complete the learning process, and the memory array can complete calculation of the weights internally, thereby overcoming the problem that The computer has to carry data between the center process unit (CPU) and the memory (the so-called von Neumann bottleneck). Traditional flash memory can also achieve this function; however, since the array must be connected in parallel in NOR form, it is difficult to be realized in a 3D memory structure. FIG. 5 is a circuit diagram of a neural network employing a flash memory array device of the present disclosure. In the longitudinal direction (the Y direction in FIG. 4), the two word lines of each flash memory are connected to each other to form the parallel first and second word lines. In the lateral direction (the X direction in FIG. 4), the bit lines of each of the flash memories are connected to each other to form the first bit line. During operation, each flash memory has a front gate and a rear gate, which are respectively connected to external circuits through different word lines. Therefore, each flash memory transistor can store two weights. FIGS. 6 and 7 shows the doping distribution inside the fin channel layer and the change of Vt of the rear gate respectively when using the TCAD (Technology Computer Aided Design) to simulate the situation of writing only the front gate of the fin channel layer. It can be seen from FIGS. 6 and 7 that the gates on the two sides of the fin channel layer operate independently. For example, the threshold voltage of the front gate is not affected by the bias of the rear gate. Therefore, under the same area, the neural network circuit implemented by the flash memory of the present disclosure can store twice as many weights as traditional ones. Thereby, the present disclosure is realized by a two-dimensional memory array, and the double gate structure helps to reduce the memory array area, and the storage density is twice that of the traditional flash memory. Moreover, by the two word lines crossing the fin channel layer, the purpose of independently controlling the two gates can be achieved with a very compact structure.

The embodiments are chosen and described in order to best explain the principles of the present disclosure and its practical applications, to thereby enable others skilled in the art best utilize the present disclosure and various embodiments with various modifications as are suited to the particular use being contemplated. It is intended that the scope of the present disclosure is defined by the following claims and their equivalents.

What is claimed is:

1. A flash memory having a plurality of control gates, comprising:
   a substrate;
   an oxide layer disposed on the substrate;
   a fin channel layer disposed on the oxide layer, comprising a first end portion, a second end portion, a top surface and two side surfaces, wherein the top surface and the two side surfaces are located between the first end portion and the second end portion, and the top surface faces away from the oxide layer and separates the two side surfaces;
   two charge storage structures disposed on the two side surfaces of the fin channel layer;
   two gate electrodes disposed on the oxide layer and respectively contacting with the two charge storage structures;
   two word conductive pillars connected to the two gate electrodes respectively and extending from the two gate electrodes in a direction leaving the oxide layer; and
   two word lines respectively connected to the two word conductive pillars, wherein an orthographic projection of the two word lines on the substrate intersects with an orthographic projection of the fin channel layer on the substrate.

2. The flash memory having a plurality of control gates according to claim 1, further comprising a bit conductive pillar and a bit line, wherein the bit conductive pillar is connected to the top surface, adjacent to the first end portion and away from the second end portion, and an orthographic projection of the bit line on the substrate intersects orthographic projections of the word lines on the substrate.

3. A flash memory having a plurality of control gates according to claim 2, wherein the word lines are located between the bit line and the two gate electrodes.

4. The flash memory having a plurality of control gates according to claim 2, wherein the bit line is located between the word lines and the two gate electrodes.

5. The flash memory having a plurality of control gates according to claim 2, wherein the two word lines are parallel to each other, and the orthographic projection of the bit line on the substrate and the orthographic projections of the word lines on the substrate are orthogonal.

6. The flash memory having a plurality of control gates according to claim 2, wherein the bit line and the word lines are parallel to the oxide layer.

7. The flash memory having a plurality of control gates according to claim 1, further comprising a substrate conductive pillar passing through the oxide layer, with one end of the substrate conductive pillar connected to the fin channel layer, adjacent to the second end portion and away from the first end portion, and with the other end of the substrate conductive post connected to the substrate.

8. The flash memory having a plurality of control gates according to claim 1, wherein the charge storage structure comprises a tunneling insulating layer, a charge storage layer disposed on an outer side of the tunneling insulating layer, and a barrier insulating layer disposed on an outer side of the charge storage layer.

9. The flash memory having a plurality of control gates according to claim 8, wherein the charge storage layer is composed of silicon nitride (SONOS) or highly-doped polysilicon.

10. The flash memory having a plurality of control gates according to claim 1, further comprising a plurality of spacers disposed on the oxide layer, wherein the spacers contact the gates and a plurality of sidewalls of the charge storage structure.

11. The flash memory having a plurality of control gates according to claim 1, wherein the fin channel layer has a portion between two orthographic projections of the two word lines on the fin channel layer, and said portion of the fin channel layer has a doping concentration between $5 \times 10^{20}$ $cm^{-1} \sim 2 \times 10^{19}$ $cm^{-1}$.

12. The flash memory having a plurality of control gates according to claim 1, wherein the fin channel layer contains silicon or germanium.

13. A flash memory array device comprising:
a first flash memory, wherein the first flash memory is a flash memory comprising a plurality of control gates as described in claim 1; and
a second flash memory, wherein the second flash memory is a flash memory comprising a plurality of control gates as described in claim 1;
wherein one of the two word lines of the first flash memory and one of the two word lines of the second flash memory jointly form a first word line, the other of the two word lines of the first flash memory and the other of the two word lines of the second flash memory jointly form a second word line, and the substrates of the first and second flash memories are two parts of a single substrate, and the oxide layers of the first and second flash memories are two parts of one oxide layer.

14. The flash memory array device according to claim 13, wherein the first word line and the second word line extend straight in one direction.

15. A flash memory array device comprising:
a first flash memory, wherein the first flash memory is a flash memory comprising a plurality of control gates as described in claim 2; and
a second flash memory, wherein the second flash memory is a flash memory comprising a plurality of control gates as described in claim 2;
wherein the bit line of the first flash memory and the bit line of the second flash memory jointly form a first bit line, and the substrates of the first and second flash memories are two parts of a single substrate, and the oxide layers of the first and second flash memories are two parts of one oxide layer.

16. The flash memory array device according to claim 15, wherein the first bit line extends straight in one direction.

17. The flash memory array device according to claim 15, wherein the first end portion of the fin channel layer of the first flash memory is connected to the second end portion of the fin channel layer of the second flash memory.

* * * * *